United States Patent
Kawaguchi (10) Patent No.: US 9,832,919 B2
(45) Date of Patent: Nov. 28, 2017

(54) ELECTRONIC CIRCUIT COMPONENT MOUNTING HEAD

(71) Applicant: FUJI MACHINE MFG. CO., LTD., Chiryu-shi (JP)

(72) Inventor: Koji Kawaguchi, Nagoya (JP)

(73) Assignee: FUJI MACHINE MFG. CO., LTD., Chiryu-shi (JP)

(*) Notice: Subject to any disclaimer, the term of this patent is extended or adjusted under 35 U.S.C. 154(b) by 248 days.

(21) Appl. No.: 14/443,789

(22) PCT Filed: Nov. 21, 2012

(86) PCT No.: PCT/JP2012/080163
§ 371 (c)(1),
(2) Date: May 19, 2015

(87) PCT Pub. No.: WO2014/080472
PCT Pub. Date: May 30, 2014

(65) Prior Publication Data
US 2015/0282398 A1 Oct. 1, 2015

(51) Int. Cl.
*B23P 19/00* (2006.01)
*H05K 13/04* (2006.01)

(52) U.S. Cl.
CPC ..... *H05K 13/0404* (2013.01); *H05K 13/0408* (2013.01); *H05K 13/0413* (2013.01); *Y10T 29/53178* (2015.01)

(58) Field of Classification Search
CPC .......... H05K 13/0413; H05K 13/0408; H05K 13/0404; Y10T 29/5313; Y10T 29/53174; Y10T 29/53178

(Continued)

(56) References Cited

U.S. PATENT DOCUMENTS

| 5,285,946 A | * | 2/1994 | Tomigashi | ......... | H05K 13/0413 228/102 |
| 7,603,766 B2 | * | 10/2009 | Kawada | ............. | H05K 13/0408 29/739 |

FOREIGN PATENT DOCUMENTS

| JP | 2000 022396 | 1/2000 |
| JP | 2004 095718 | 3/2004 |

(Continued)

OTHER PUBLICATIONS

Extended European Search Report dated Jul. 22, 2016 in Patent Application No. 12888874.0.

(Continued)

*Primary Examiner* — Donghai D Nguyen
(74) *Attorney, Agent, or Firm* — Oblon, McClelland, Maier & Neustadt, L.L.P.

(57) ABSTRACT

An electronic circuit component mounting head which mounts electronic circuit components to a circuit substrate is provided. The mounting head includes a rotating/raising/lowering axis held on a head main body as to be capable of rotation and of being raised/lowered, a suction nozzle held on the rotating/raising/lowering axis as to be capable of being raised/lowered and not capable of being rotated relatively, and the rotating/raising/lowering axis and suction nozzle can be rotated as necessary by an electric motor. A raising/lowering driving member is held on head main body as to be capable of being raised/lowered, and is raised/lowered by a first linear motor. A first engaging section of the raising/lowering driving member is engaged with the rotating/raising/lowering axis, and a second engaging section of a second linear motor is held on the raising/lowering driving member engaged with suction nozzle.

3 Claims, 6 Drawing Sheets

(58) Field of Classification Search
USPC .................................. 29/739, 740; 228/102
See application file for complete search history.

(56) References Cited

FOREIGN PATENT DOCUMENTS

| | | |
|---|---|---|
| JP | 2005-32860 A | 2/2005 |
| JP | 2006-156443 A | 6/2006 |
| JP | 2007 080970 | 3/2007 |
| JP | 2010 027751 | 2/2010 |
| JP | 2010 027752 | 2/2010 |
| JP | 2011 040551 | 2/2011 |

OTHER PUBLICATIONS

International Search Report dated Jan. 15, 2013, in PCT/JP12/080163 filed Nov. 21, 2012.
U.S. Appl. No. 14/443,721, filed May 19, 2015, Kawaguchi.

* cited by examiner

ELECTRONIC CIRCUIT COMPONENT MOUNTING HEAD

TECHNICAL FIELD

The present disclosure relates to an electronic circuit component mounting head (hereafter abbreviated to mounting head unless there is a specific need) of an electronic circuit component mounter (hereafter abbreviated to mounter unless there is a specific need) which holds electronic circuit components (hereafter abbreviated to components unless there is a specific need) with a component holding tool such as a suction nozzle and mounts them on a circuit substrate. In particular, it relates to a mounting head which, in cases in which damage occurs easily due to the impact during contact with the component holding tool or contact with the circuit substrate (hereafter abbreviated to contact impact unless there is a specific need) because components are fragile, enables mounting with high efficiency while controlling the contact impact, to be small.

BACKGROUND ART

In patent literature 1 below, a mounter which can mount components on a circuit substrate with high efficiency while mitigating the contact impact is disclosed. With the mounting head of this mounter, as well as a nozzle holding section which detachably holds a suction nozzle being held as to be capable of being relatively raised/lowered and not capable of being relatively rotated on a rotating/raising/lowering axis which is raised/lowered by a first raising/lowering driving device which is supported on the head main body as to be movable up/down and rotatable, a second raising/lowering driving device is provided between those rotating/raising/lowering axes and the nozzle holding sections. The second raising/lowering driving device is a voice coil motor type linear motor, for which a cylindrical body around which is wound a coil is fixed to the rotating/raising/lowering axis, while a yoke body which surrounds the coil from the outside and has permanent magnets fixed to the center section thereof is fixed to the nozzle holding section, and the nozzle holding section is raised/lowered with respect to the rotating/raising/lowering axis.

Also, a mounting head which can mount components onto a circuit substrate at high speed while mitigating the contact impact is disclosed in patent literature 2. On this mounting head, a shaft is held on a raising/lowering body which is raised/lowered by a rotating motor and feed screw such that the shaft can be relatively raised/lowered a limited distance, and a suction nozzle is attached to the lower section of this shaft via a pressure detection section. The shaft is raised/lowered by a voice coil motor; the pressure detection section is an item for detecting the force that the suction nozzle applies to the component, or the force that a component held by the suction nozzle applies to a circuit substrate, by a load cell; the voice coil motor is controlled based on the detection result; and a compression spring is provided between the load cell and shaft. Also, the suction nozzle is rotated by the shaft being rotated by a θ motor.

Also, in patent literature 3 below, a suction nozzle raising/lowering device which enables the mounting of components with a correct load is disclosed. This raising/lowering device is also an item for raising/lowering a shaft holding a suction nozzle using a voice coil motor with respect to a raising/lowering body which is raised/lowered by a rotating motor and feed screw, and the applied load of the suction nozzle is detected by a load cell via the shaft, the voice coil motor is controlled based on the detection result, and a spring is provided between the shaft and voice coil motor. Also, the suction nozzle is rotated by the shaft holding the suction nozzle being rotated by a θ motor.

Further, disclosed in patent literature 4 is detecting the contact position of a component and a suction nozzle or the contact position of a component held on a suction nozzle and a circuit substrate by detecting the position at which the moving acceleration rate of the suction nozzle changes, or by detecting the position at which the noise applied to the means for determining the movement position of a suction nozzle changes, which are due to the suction nozzle contacting the component, or the component held on the suction nozzle contacting the circuit substrate. Also, disclosed is a means for determining the movement position of a suction nozzle is configured from a servo motor and a rack and pinion for changing the rotation of the servo motor into straight line movement, and detecting the position at which the load torque on the servo motor changes as the above contact position. It is also disclosed that a linear motor may be used for driving the suction nozzle. However, in patent literature 4, an R axis rotation mechanism which rotates a suction nozzle about an axis line is also disclosed, and that a suction nozzle and nozzle holding axis are one body is also disclosed; there is nothing disclosed with regard to a suction nozzle or nozzle holding axis which are each driven separately by a driving device and a suction nozzle being raised/lowered relative to a nozzle holding axis.

CITATION LIST

Patent Literature

Patent Literature 1: JP-A-2004-95718
Patent Literature 2: JP-A-2007-80970
Patent Literature 3: JP-A-2011-40551
Patent Literature 4: JP-A-2000-22396

SUMMARY

Problem to be Solved

There are still points which should be improved in each of the above cited patent literature. For example, due to at least one of: the weight of the item which is raised/lowered being large because a nozzle holding axis and so on which holds and raises/lowers a suction nozzle is raised/lowered by second raising/lowering driving device; and sensitive detection of the contact of the suction nozzle on the target item not being possible because an elastic body is interposed between the load cell and suction nozzle; it is difficult to make control of the second raising/lowering driving device sensitive and the contact impact sufficiently small. Also, because a suction nozzle is raised/lowered with respect to a raising/lowering member which is raised/lowered by a first raising/lowering driving device, a nozzle holding axis which holds a suction nozzle is raised/lowered by a second raising/lowering driving device; and because this second raising/lowering driving device cannot be shared for use for multiple sets of nozzle holding axis and suction nozzle, there is the problem that the machine cost is high when multiple sets of nozzle holding axis and suction nozzle are provided on the mounting head.

An object of the present disclosure is to solve at least one of these problems.

Means for Solving the Problem

In the present disclosure, to solve the above problems, an electronic circuit component mounting head of an electronic circuit component mounter which holds an electronic circuit component by a component holding tool such as a suction nozzle and mounts an electronic circuit component on a circuit substrate comprises: (a) a head main body; (b) a raising/lowering member which is guided on the head main body as to be capable of being raised/lowered; (c) a first raising/lowering driving device which raises/lowers the raising/lowering member with respect to the head main body; (d) a component holding tool which holds an electronic circuit component and is held as to be capable of being raised/lowered relative to the raising/lowering member by the raising/lowering member; (e) a second raising/lowering driving device which is raised/lowered together with the raising/lowering member by the first raising/lowering driving device and which raises/lowers the component holding tool relative to the raising/lowering member; (f) and a biasing means provided between the raising/lowering member and the component holding tool, wherein the biasing means biases the component holding tool either up or down relative to the raising/lowering member, and wherein the second raising/lowering driving device engages with the component holding tool against the biasing force of the biasing means without acting via an elastic member, and in that state, the second raising/lowering driving device mounts an electronic circuit component on a circuit substrate.

Effects

With an electronic circuit component mounting head with the above configuration, if a biasing means biases the component holding tool upwards relative to a raising/lowering member, the load with respect to the second raising/lowering driving device is increased rapidly when the component holding tool contacts an electronic circuit component, or when an electronic circuit component held on the component holding tool contacts a circuit substrate, in a state while the second raising/lowering driving device pushes the component holding tool against the biasing force. Because the operation of second raising/lowering driving device is controlled based on the detection of that fact, and the increase in the driving force is controlled sensitively, the contact impact is favorably mitigated and damage is avoided to even fragile electronic circuit components. Also, when the biasing means biases the component holding tool downwards relative to a raising/lowering member, the above contact occurs during lowering while the second raising/lowering driving device is backing up the component holding tool against the biasing force, and the load with respect to the second raising/lowering driving device is decreased rapidly. Because the operation of second raising/lowering driving device is controlled based on the detection of that fact, and the driving force is increased rapidly, the contact impact is favorably mitigated and damage is avoided to even fragile electronic circuit components. In both cases, because the second raising/lowering driving device is engaged with the component holding tool without acting via an elastic member, the change in the load with respect to that can be detected sensitively; and because the weight of the component holding tool compared to the raising/lowering member can be considerably smaller, and thus the biasing force of the biasing means can also be small, the second raising/lowering driving device itself can be small, it is easy to perform control for mitigating the contact impact with good accuracy, and the mitigating the contact impact can be performed easily and favorably.

Forms of the Invention

Several exemplary embodiments of the disclosure are described as follows.

In one embodiment, an electronic circuit component mounting head which mounts electronic circuit components on a circuit substrate comprising: a head main body; a raising/lowering member which is guided on the head main body as to be capable of being raised/lowered; a first raising/lowering driving device which raises/lowers the raising/lowering member with respect to the head main body; a component holding tool which holds an electronic circuit component and is held as to be capable of being raising/lowered relative to the raising/lowering member by the raising/lowering member; and a second raising/lowering driving device which is raised/lowered together with the raising/lowering member by the first raising/lowering driving device and which raises/lowers the component holding tool relative to the raising/lowering member.

With the mounting head of this embodiment, the raising/lowering member and the second raising/lowering driving device are raised/lowered with respect to the head main body by the first raising/lowering driving device, and the component holding tool is further raised/lowered with respect to the raising/lowering member by the second raising/lowering driving device. Due to this, the raising/lowering distance of the component holding tool by the second raising/lowering driving device and the load with respect to the second raising/lowering driving device are only small. As a result, it is easy to control the contact impact when the component holding tool contacts an electronic circuit component, or the contact impact when an electronic circuit component held on the component holding tool contacts a circuit substrate, to be small.

In another embodiment, the raising/lowering member is held on the head main body to be rotatable about its own axis line and is a rotating/raising/lowering axis which supports the component holding tool such that relative rotation is not possible. The electronic circuit component mounting head further comprises a raising/lowering axis rotating device which rotates that rotating/raising/lowering axis, wherein the second raising/lowering driving device is provided on the outside of the rotating/raising/lowering axis and the component holding tool and is equipped with a holding tool engaging section which engages with the component holding tool in a state which allows rotation of the component holding tool without acting via an elastic member, and the second raising/lowering driving device mounts electronic circuit components on a circuit substrate by raising/lowering the component holding tool relative to the rotating/raising/lowering axis using the holding tool engaging section.

The rotating/raising/lowering axis may be indirectly held or directly held on the head main body as to be rotatable and capable of being raised/lowered. For example, the rotating/raising/lowering axis may be rotatably held on a raising/lowering body which is held on the head main body as to be capable of being raised/lowered.

In another embodiment, the first raising/lowering driving device is fixed to the head main body, and is equipped with a raising/lowering axis engaging section which engages with the rotating/raising/lowering axis in a state which allow rotation of that rotating/raising/lowering axis.

In another embodiment, the holding tool engaging section engages with the component holding tool in a state which allows the withdrawal of the component holding tool.

According to this embodiment, the holding tool engaging section and the component holding tool can be withdrawn from each other and, for example, exchange of the component holding tool is easy.

In another embodiment, the holding tool engaging section engages with the component holding tool in a state which allows withdrawal of the component holding tool in a direction intersecting with the raising/lowering direction of the component holding tool.

According to this embodiment, by the relative movement in a direction intersecting the raising/lowering direction of that component holding tool, at least the component holding tool can be in a state engaged with the second raising/lowering driving device and in a state withdrawn from the second raising/lowering driving device. For example, the component holding tool can be made detachable with respect to the rotating/raising/lowering axis, and one second raising/lowering driving device can be shared for use for multiple component holding tools.

In another embodiment, the first raising/lowering driving device is equipped with a raising/lowering axis engaging section which engages with the rotating/raising/lowering axis as to be capable of being withdrawn in a direction intersecting with the raising/lowering direction of the rotating/raising/lowering axis, wherein the second raising/lowering driving device is capable of being raised/lowered together with the rotating/raising/lowering axis through the outside of the head main body, and is held on a holding section as to be movable relative to the head main body in a direction intersecting with the raising/lowering direction. The holding tool engaging section engages with the component holding tool as to be capable of being engaged and withdrawn according to the engaging and withdrawing of the raising/lowering axis engaging section with the rotating/raising/lowering axis.

According to this embodiment, the first raising/lowering driving device and second raising/lowering driving device, and the rotating/raising/lowering axis and the component holding tool, can be engaged and withdrawn in a direction intersecting with the raising/lowering direction. Accordingly, one set of first raising/lowering driving device and second raising/lowering driving device can be shared for use for multiple sets of rotating/raising/lowering axis and component holding tool, and the configuration of the electronic circuit component mounting head can be simplified.

In another embodiment, the head main body is equipped with a first section which holds the rotating/raising/lowering axis as to be capable of being rotated and raised/lowered, and a second section which holds the number one raising/lowering driving device and the second raising/lowering driving device. The component mounting head further comprises a relative movement device which moves those first section and second section relatively in a direction intersecting the raising/lowering direction of the rotating/raising/lowering axis. By the operating of that relative movement device, the holding tool engaging section and the raising/lowering axis engaging section, and the component holding tool and the rotating/raising/lowering axis, are engaged and withdrawn. The relative movement device, for example, may be a first section rotating device which rotates the first section about an axis line and moves a rotating/raising/lowering axis, which is held as to be capable of being raised/lowered at multiple positions on a circumference centered around that axis line, relative to the first raising/lowering driving device and second raising/lowering driving device, which are held on the second section so as not to be capable of relative movement with respect to the axis line, in a direction intersecting the raising/lowering direction; or may be a first section moving device which moves the first section in a straight line or along a curve, and which moves multiple rotating/raising/lowering axes which are held so as to be capable of being raised/lowered at multiple positions along that straight line or curve and component holding tools held on those rotating/raising/lowering axes relatively in a direction intersecting the raising/lowering direction with respect to the first raising/lowering driving device and the second raising/lowering driving device which are held on the second section; or may be such that the items which do the rotating or moving are reversed.

As a representative example of a form with the rotating item reversed, there is a form which, with respect to a first section which holds a rotating/raising/lowering axis as to be capable of being raised/lowered and rotated at multiple positions on a circumference, rotates a second section which holds the first raising/lowering driving device and second raising/lowering driving device around an axis line which is at the center of the circumference.

In another embodiment, the head main body holds the rotating/raising/lowering axis as to be capable of being raised/lowered and rotated at multiple positions on a circumference centered around an axis line. The electronic circuit component mounting head further comprises a component holding tool all together rotating driving device which is equipped with (a) multiple pinions provided on each of the multiple rotating/raising/lowering axes, (b) a gear provided commonly for those multiple pinions, and (c) a rotating driving source which rotates the multiple pinions together by rotating that gear, wherein the component holding tool all together rotating driving device rotates all together the multiple component holding tools held on the rotating/raising/lowering axes such that relative rotation is not possible.

According to this embodiment, multiple sets of rotating/raising/lowering axis and component holding tool can be rotated together using a common rotating driving source. When multiple sets of rotating/raising/lowering axis and component holding tool are rotated together in this way, it is particularly desirable to be able to rotate each set of rotating/raising/lowering axis and component holding tool to an infinite angle, in which case, if the form is such that second raising/lowering driving device is rotated together with the rotating/raising/lowering axes, it is necessary to provide a sliding section somewhere on the wiring used for supplying power and extracting signals to the second raising/lowering driving device, which would become a source of large electrical noise. However, in some embodiments, a sliding section is not required, and the occurrence of electrical noise can be avoided.

It should be noted that the head main body of this embodiment may be an item which is capable of rotating the portion which holds multiple rotating/raising/lowering axes, or may be an item which is not capable of rotating the portion which holds multiple rotating/raising/lowering axes.

In another embodiment, the mounting head further comprises: a biasing means which biases the component holding tool relative to a rotating/raising/lowering axis in either an upwards or downwards direction is provided between the rotating/raising/lowering axis and the component holding tool. The second raising/lowering driving device engages with the component holding tool against the biasing force of the biasing means by the holding tool engaging section, and in that state, the second raising/lowering driving device mounts an electronic circuit component on a circuit substrate.

In another embodiment, the mounting head further comprises: a stopper provided on the rotating/raising/lowering axis which defines the upper raising limit or lower lowering limit of the component holding tool based on the biasing force of the biasing means. The second raising/lowering driving device separates the component holding tool which contacts the stopper due to the biasing force of the biasing means from the stopper against the biasing force of that biasing means. In that state, the second raising/lowering driving device mounts an electronic circuit component on a circuit substrate.

In another embodiment, the mounting head further comprises: a biasing means which biases the component holding tool relative to a raising/lowering member in either an upwards or downwards direction is provided between the raising/lowering member and the component holding tool. The second raising/lowering driving device engages with the component holding tool against the biasing force of that biasing means without acting via an elastic member. In that state, the second raising/lowering driving device mounts an electronic circuit component on a circuit substrate.

In another embodiment, the mounting head further comprises: a stopper provided on the raising/lowering member which defines the upper raising limit or lower lowering limit of the component holding tool based on the biasing force of the biasing means. The second raising/lowering driving device separates the component holding tool which contacts the stopper due to the biasing force of the biasing means from the stopper against the biasing force of that biasing means. In that state, the second raising/lowering driving device mounts an electronic circuit component on a circuit substrate.

(In another embodiment, the second raising/lowering driving device is provided outside of the raising/lowering member and the component holding tool, and includes a holding tool engaging section which engages the component holding tool, and drives the component holding tool in a state in which the component holding tool is engaged via the holding tool engaging section in a direction against the biasing force of the biasing means, and separates the component holding tool from the stopper.

In another embodiment, the second raising/lowering driving device is provided outside of the raising/lowering member and the component holding tool, and includes a holding tool engaging section which engages with the component holding tool, and a gap is formed between the holding tool engaging section and the component holding tool in a state in which the component holding tool contacts the stopper due to the biasing means.

According to this embodiment, if the component holding tool and holding tool engaging section are moved relatively in a direction intersecting with the raising/lowering direction of the raising/lowering member and component holding tool, in a state in which the component holding tool is contacting the stopper, no friction force acts between the component holding tool and the holding tool engaging section, making it easy to use.

In another embodiment, the holding tool engaging section engages with the component holding tool in a state which allows at least one of (a) rotation of the component holding tool about an axis line of the holding tool itself, and (b) relative movement of the component holding tool in a direction intersecting that axis line.

When the holding tool engaging section engages with the component holding tool in a state which allows rotation of the component holding tool, the component holding tool can be rotated without rotating or revolving the second raising/lowering driving device. When the holding tool engaging section engages with the component holding tool in a state which allows relative movement in a direction intersecting that axis line of the component holding tool, it is possible to relatively move the second raising/lowering driving device and the component holding tool in a direction intersecting with the raising/lowering direction. For example, one second raising/lowering driving device can be shared for use for multiple component holding tools.

In another embodiment, the second raising/lowering driving device includes a linear motor as the drive source and a drive circuit connected to that linear motor. The drive circuit includes a counterforce detection section which detects the counterforce with respect to the component holding tool, the drive circuit includes an impact mitigating section which mitigates the impact when the component holding tool contacts an electronic circuit component, and when an electronic circuit component held by the component holding tool contacts a circuit substrate, by controlling the current supplied to the linear motor based on the counterforce detected by that counterforce detection section.

As a counterforce detection section, a load cell which directly detects the counterforce, or an indirect counterforce detection section which detects the counterforce indirectly, for example, the noise estimation observer disclosed in JP-A-6-131050, can be used.

According to this embodiment, the contact of the component holding tool with an electronic circuit component, and of an electronic circuit component being held by the component holding tool with a circuit substrate can be detected, and the impact during this contact can be mitigated by controlling the current supplied to the linear motor based on that detection.

In particular, in some embodiments, the above contact can be detected sensitively, and the impact during contact can be mitigated all the more favorably.

Here, it is desirable for the impact mitigating section to include a high frequency control section which can perform multiple cycle supply current control within the assumed time in which the counterforce increases from the force before contact to the force after contact is complete in a state in which that impact mitigating section does not operate. The higher this control cycle count, the more favorably impact can be mitigated.

DESCRIPTION OF EMBODIMENTS

Below, embodiments of the disclosure are described with reference to the figures. It should be noted that the disclosure, as well as the below embodiment, can be embodied in various changed forms based on the knowledge of someone skilled in the art, such as each of the forms given in the above section "Forms of the Disclosure."

Figure 1:
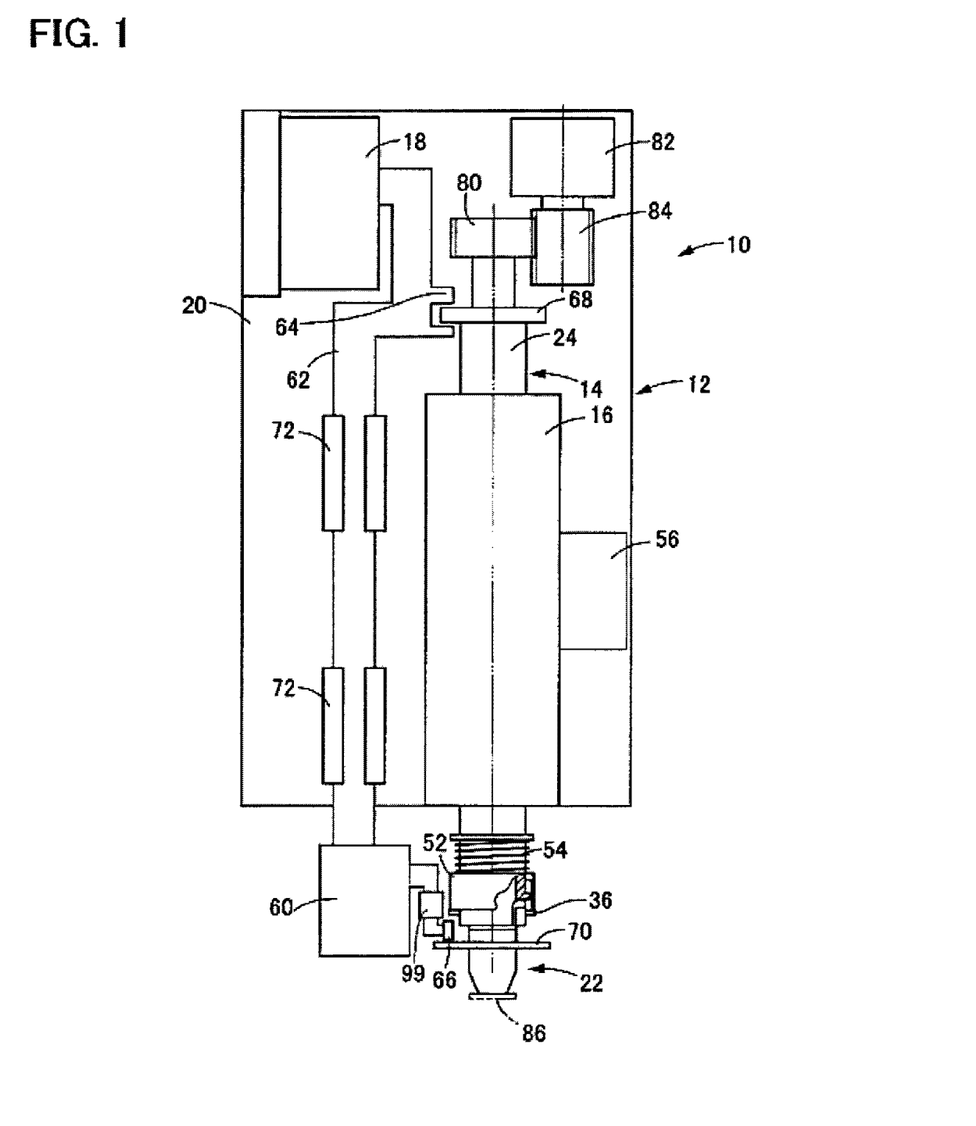
FIG. 1 is a front view of a mounting head according to one embodiment of the disclosure.
Figure 2A:
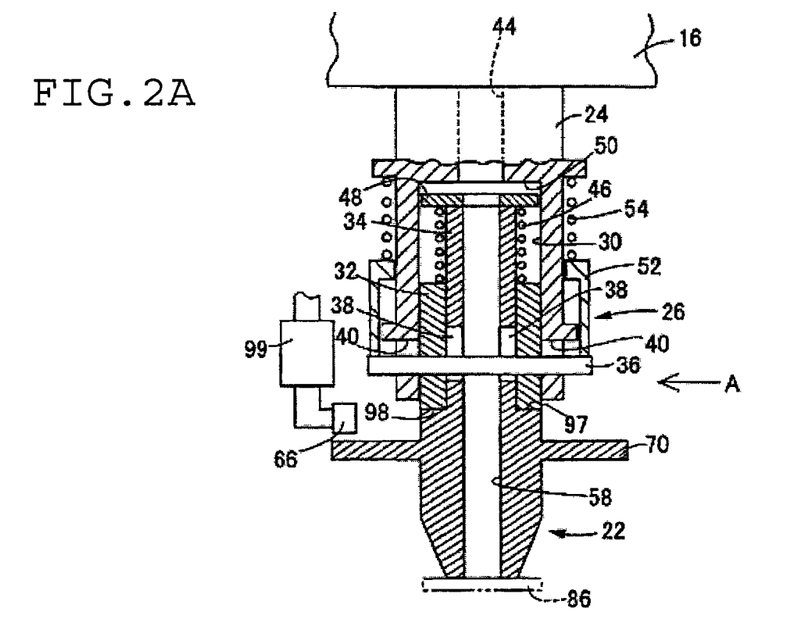
FIG. 2A is a partial cross-section front view showing the area around a suction nozzle of the above mounting head.

An example of a basic configuration of mounting head 10 is shown in FIG. 1. This mounting head 10 is equipped with mounting head main body 12, and this mounting head main body 12 is equipped with first section 16 which holds rotating/raising/lowering axis 14 in a state which allows raising/lowering in a direction parallel to the axis line of that rotating/raising/lowering axis 14 and rotation about that axis line, and a second section 20 which fixedly holds first linear motor 18. In the present embodiment, first section 16 and second section 20 are fixed to each other. Rotating/raising/lowering axis 14 holds suction nozzle 22 as a component holding tool at the lower end. Rotating/raising/lowering axis 14, as shown enlarged in FIG. 2A, is equipped with raising/lowering axis main body 24 and nozzle holding section 26 which is detachably attached to that raising/lowering axis main body 24; nozzle holding section 26 is attached/detached to/from raising/lowering axis main body 24 with a suction nozzle 22 held as to be capable of relative movement in the axis direction and not capable of relative rotation. Nozzle holding section 26, after being mounted on raising/lowering axis main body 24, functions as part of rotating/raising/lowering axis 14.

Figure 2B:
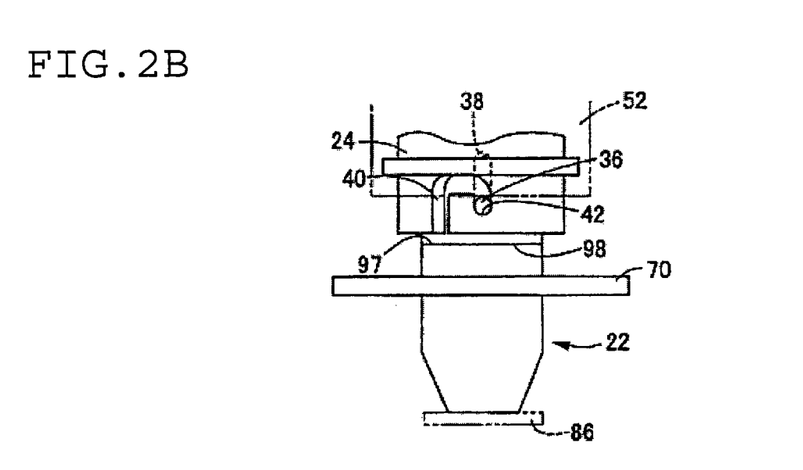
FIG. 2B is a view from A in FIG. 2A.

Rotating/raising/lowering axis 14 is equipped with engaging hole 30 at the lower end for which the cross-section shape is circular; nozzle holding section 26 is equipped with nozzle holding member 32 which is cylindrical; and that nozzle holding member 32 is engaged on the outer surface as to be capable of relative rotation and relative movement in the axis direction with engaging hole 30, and is engaged on the inner surface as to be capable of relative movement in the axis direction of axis section 34 of suction nozzle 22. Pin 36 is fixed to nozzle holding member 32 passing through it in the diameter direction. With pin 36, at an intermediate section, elongated hole 38 is formed lengthily in the axis direction of axis section 34 of suction nozzle 22 such that pin 36 can pass through slidably; while both end sections protrude from the outer surface of nozzle holding member 32, slidably pass through two cutouts 40 formed in the lower end of raising/lowering axis main body 24, and protrude from the outer surface of raising/lowering axis main body 24. Each cutout 40, as shown in FIG. 2B, after extending upwards from the bottom surface of raising/lowering axis main body 24, curves to be perpendicular and extends in a circumferential direction, and further has a short vertical shape downwards from that end; nozzle holding member 32 engages raising/lowering axis main body 24 from the bottom opening of engaging hole 30, and after being rotated by a fixed angle, in accordance with being lowered, each end of pin 36 engages with cutout 40, and finally pin 36 is received by pin receiving section 42 which extends shortly vertically in cutout 40. In this state, pin 36 passes through raising/lowering axis main body 24, nozzle holding member 32, and axis section 34 of suction nozzle 22, and is in a state which prevents the relative rotation of those three items. Thus, if rotating/raising/lowering axis 14 is rotated, suction nozzle 22 is rotated together as well.

Negative pressure passage 44 is formed in the central section of raising/lowering axis main body 24, and is connected to engaging hole 30. After axis section 34 of suction nozzle 22 is passed through nozzle holding member 32, as well as compression coil spring 46 being engaged, flange member 48 is secured at the top of axis section 34. As above, in a state in which nozzle holding member 32 is engaged with engaging hole 30 and pin 36 is received in pin receiving section 42, flange member 48 separates from stepped surface 50 formed at the boundary between engaging hole 30 and negative pressure passage 44, and stepped surface 97 of suction nozzle 22 is held in a state being pushed against bottom surface 98 of nozzle holding member 32. This bottom surface 98 configures a stopper which defines the relative upper raising limit of suction nozzle 22 with respect to rotating/raising/lowering axis 14. As above, because negative pressure passage 44 is connected to engaging hole 30, if negative pressure is supplied to negative pressure passage 44, a pulling up force acts on suction nozzle 22 and nozzle holding member 32 to pull them up; therefore a lock mechanism is provided to prevent the lifting of pin 36 from pin receiving section 42 due to this force. Lock sleeve 52 is slidably engaged on the outside of raising/lowering axis main body 24, and pin 36 is pushed into pin receiving section 42 by being biased downwards by compression coil spring 54. Negative pressure passage 44 inside rotating/raising/lowering axis 14 is connected to negative pressure passage 58 inside suction nozzle 22.

The first linear motor 18 functions as the first raising/lowering driving device which raises/lowers rotating/raising/lowering axis 14 as the first raising/lowering member and the second linear motor 60 as the second raising/lowering driving device together. Due to this, raising/lowering driving member 62 as the second raising/lowering member is attached to first linear motor 18.

Raising/lowering/driving member 62 extends on the outside of first section 16 of head main body 12 in the vertical direction along rotating/raising/lowering axis 14, has first engaging section 64 in an intermediate section, and holds second linear motor 60 on the bottom section. That second linear motor 60 has second engaging section 66 (configured from a roller which is rotatable about a horizontal axis line). First engaging section 64 and second engaging section 66 are respectively engaged with flange 68 provided near the top of rotating/raising/lowering axis 14 and flange 70 of suction nozzle 22 in a state which allows the rotation of rotating/raising/lowering axis 14 and suction nozzle 22. Guide 72 is attached to second section of head main body 12 and guides raising/lowering driving member 62.

Gear 80 is provided above flange 68 of rotating/raising/lowering axis 14, and engages with fixed gear 84 on the rotating axis of electric motor 82 which forms the rotating driving source attached to head main body 12. Gears 80 and 84, as well as allowing the raising/lowering of rotating/raising/lowering axis 14, transmit the rotation of electric motor 82 to rotating/raising/lowering axis 14. The rotating driving device of rotating/raising/lowering axis 14 is configured from electric motor 82, and gears 80 and 84; the rotation of rotating/raising/lowering axis 14 is transmitted to nozzle holding member 32 by the engagement of pin receiving section 42 and pin 36, and further transmitted to suction nozzle 22 by the engagement of pin 36 and elongated hole 38.

Mounting head 10, as well as being moved above a component supply device and a board holding device which holds a printed board as a circuit substrate along the X-Y plane by an X-Y moving device which is omitted from the figures, is raised/lowered in the Z direction which is perpendicular to the X-Y plane, picks up and removes a component 86 from the component supply device using suction nozzle 22 and mounts the component on the printed board. Here, first linear motor 18 lowers raising/lowering driving member 62, lowers rotating/raising/lowering axis 14 and second linear motor 60; along with this, second linear motor 60 lowers suction nozzle 22 relative to rotating/raising/lowering axis 14. It follows that the raising/lowering of the above mounting head 10 can be omitted. Also, electric motor 82 is operated as necessary such that the rotation orientation of a component held on suction nozzle 22 is corrected or changed. Control of first linear motor 18, negative pressure control valve 56, electric motor 82, and so on during the above operation is the same as for a normal mounting head, so descriptions are omitted; below, control of the special second linear motor 60 is described.

Figure 3:
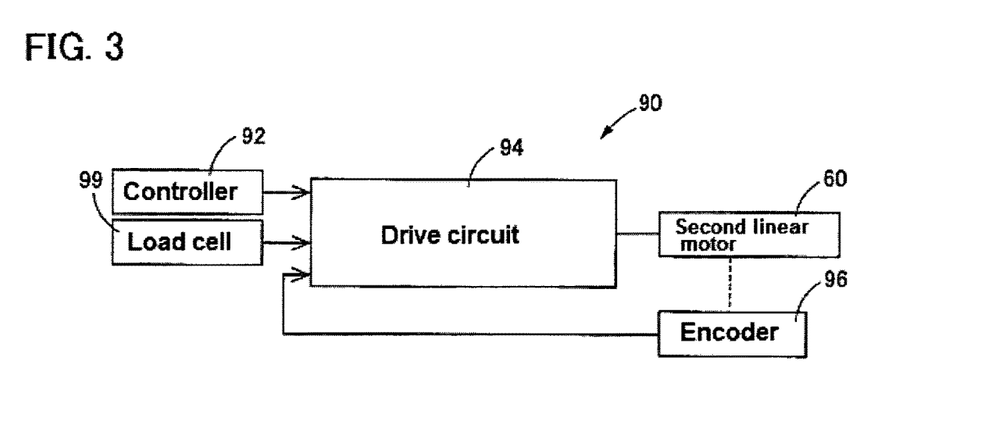
FIG. 3 is a block diagram showing the control device of the second linear motor of the above mounting head.

Second linear motor 60 is controlled by control system 90 shown in FIG. 3. Control system 90 is configured from a section of controller 92 which controls the mounter overall including mounting head 10, drive circuit 94, and load cell 99 and encoder 96 which come with second linear motor 60. Controller 92 issues a command for the position of second linear motor 60 and drive circuit 94 supplies to second linear motor 60 the current required to make this commanded position and the position indicated by encoder 96 match.

Figure 4:
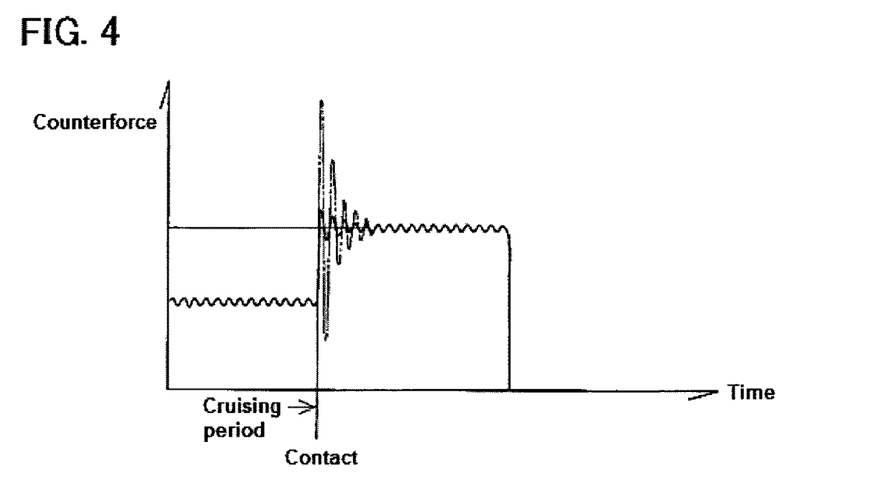
FIG. 4 is a graph showing the current of the second linear motor controlled by the above control device.

Within components 86 there are fragile components which may be damaged by the impact when suction nozzle 22 contacts component 86 in order to remove the component, or when component 86 held by suction nozzle 22 contacts the printed board in order to mount the component. This mounting head 10 is devised to perform efficient mounting work while avoiding damage even for those kinds of components 86. In other words, when lowering suction nozzle 22, first linear motor 18 is operated, raising/lowering driving member 62 is lowered, and rotating/raising/lowering axis 14 and second linear motor 60 are lowered. At the same time, second linear motor 60 is operated, and before component 86 contacts suction nozzle 22 or the printed board, suction nozzle 22 is separated from bottom surface 98 which forms a stopper by a specified distance against the biasing force of compression coil spring 46. The cruising period in FIG. 4 is the period in which suction nozzle 22 is being lowered together with rotating/raising/lowering axis 14.

Then, suction nozzle 22 contacts component 86 held in the component supply device, or component 86 held by suction nozzle 22 contacts a printed board. Supposing that second linear motor 60 and control system 90 are not provided, and instead, as with a conventional mounting head, a compression coil spring which functions as a cushion is provided between suction nozzle 22 and rotating/raising/lowering axis 14, the contact force increases rapidly during the above contact, and damage may occur to component 86; also, in cases in which the control of control system 90 is insufficient, the counterforce to second linear motor 60 becomes bigger as shown by an example in FIG. 4 by the double-dashed line, and likewise there is a possibility that component 86 will be damaged. However, in the present disclosure, control system 90 starting with drive circuit 94 is capable of high frequency control, in other words, is a high frequency control system capable of performing cycle control of at least two cycles before the counterforce caused by the above contact increases rapidly and become excessively large such that the contact force exceeds the permissible contact force, so that control system 90 controls the current supplied to second linear motor 60 such that the counterforce is equal to a specified pushing force as soon as load cell 99 detects the contact. As a result, the change in the counterforce is controlled to be smaller as shown by the solid line, to be of a size at which the contact impact during the above contact does not cause damage to component 86. The section of control system 90 which performs this current control configures the impact mitigating section.

Figure 5:
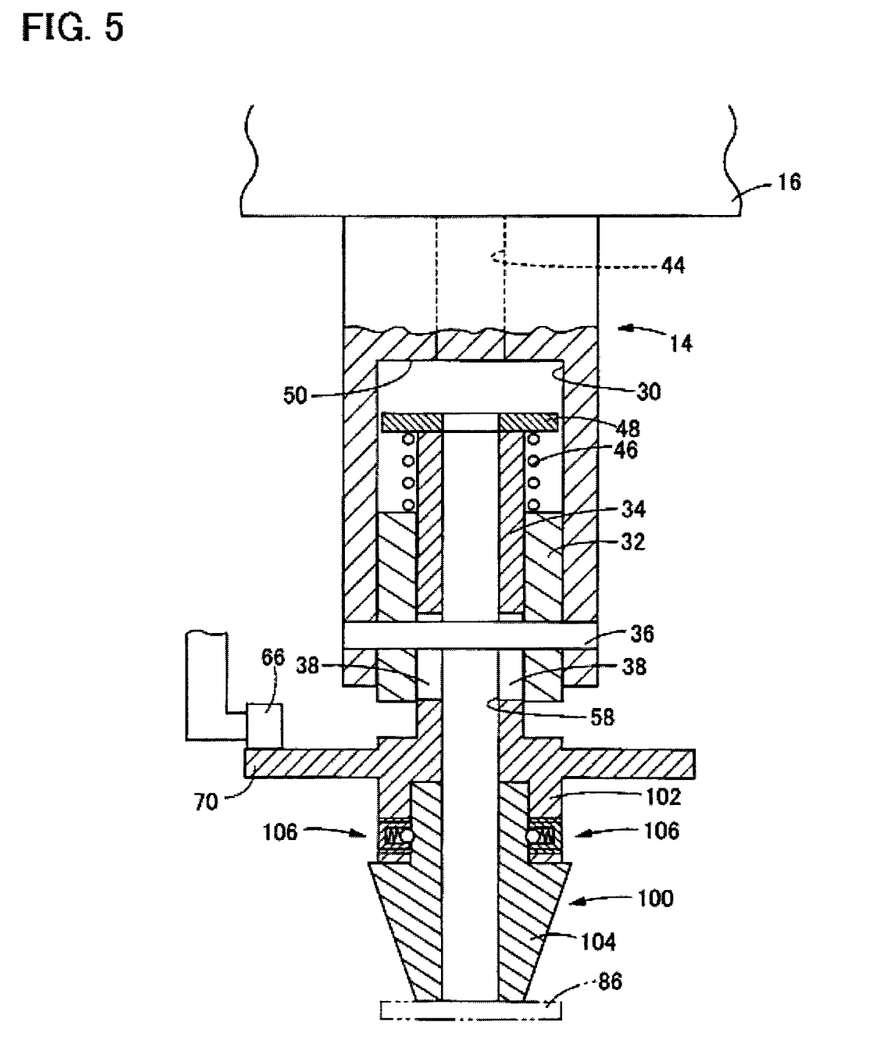
FIG. 5 is a partial cross-section front view showing the area around a suction nozzle of the mounting head of a different embodiment of the disclosure.

Another embodiment of the disclosure is shown in FIG. 5. This embodiment differs from the above embodiment mainly in the form of exchange of the suction nozzle. In contrast to the above embodiment, in which suction nozzle 22 was detachable with respect to raising/lowering axis main body 24 along with nozzle holding member 32 and pin 36, in this embodiment, suction nozzle 100 is formed from nozzle main body 102 and tip member 104, and tip member 104 is detachable with respect to nozzle main body 102. Various means for realizing this detachability exist; in the example shown in FIG. 5, ball plunger 106 is used. The attachment state of tip member 104 is such that the ball of ball plunger 106 attached to nozzle main body 102 is engaged with a recess formed in tip member 104, so that when force is applied to tip member 104 in the direction for its removal, tip member 104 can be removed from nozzle main body 102.

The embodiment shown in FIG. 5 is further different from the previous embodiment in that it is not provided with a stopper which defines the approaching limit to rotating/raising/lowering axis 14 of suction nozzle 100 due to the biasing force of compression coil spring 46, instead second engaging section 66 of second linear motor 60 is always engaged with flange 70 of suction nozzle 100. In cases in which there is only one rotating/raising/lowering axis 14, and in cases in which there are multiple rotating/raising/lowering axes 14 and there is a dedicated raising/lowering driving member 62 and second linear motor 60 with respect to each rotating/raising/lowering axis 14, it is possible to omit the stopper by the second engaging section 66 always being engaged with flange 70 of suction nozzle 100.

It should be noted that a raising/lowering member which does not rotate may be provided instead of rotating/raising/lowering axis 14. For example, it is possible to rotate a section of the head main body which holds a raising/lowering member which does not rotate as to be capable of being raised/lowered, or to rotate the device which holds the printed board, and in these cases in which rotating the component is not necessary, that kind of thing is also not necessary.

Figure 6:
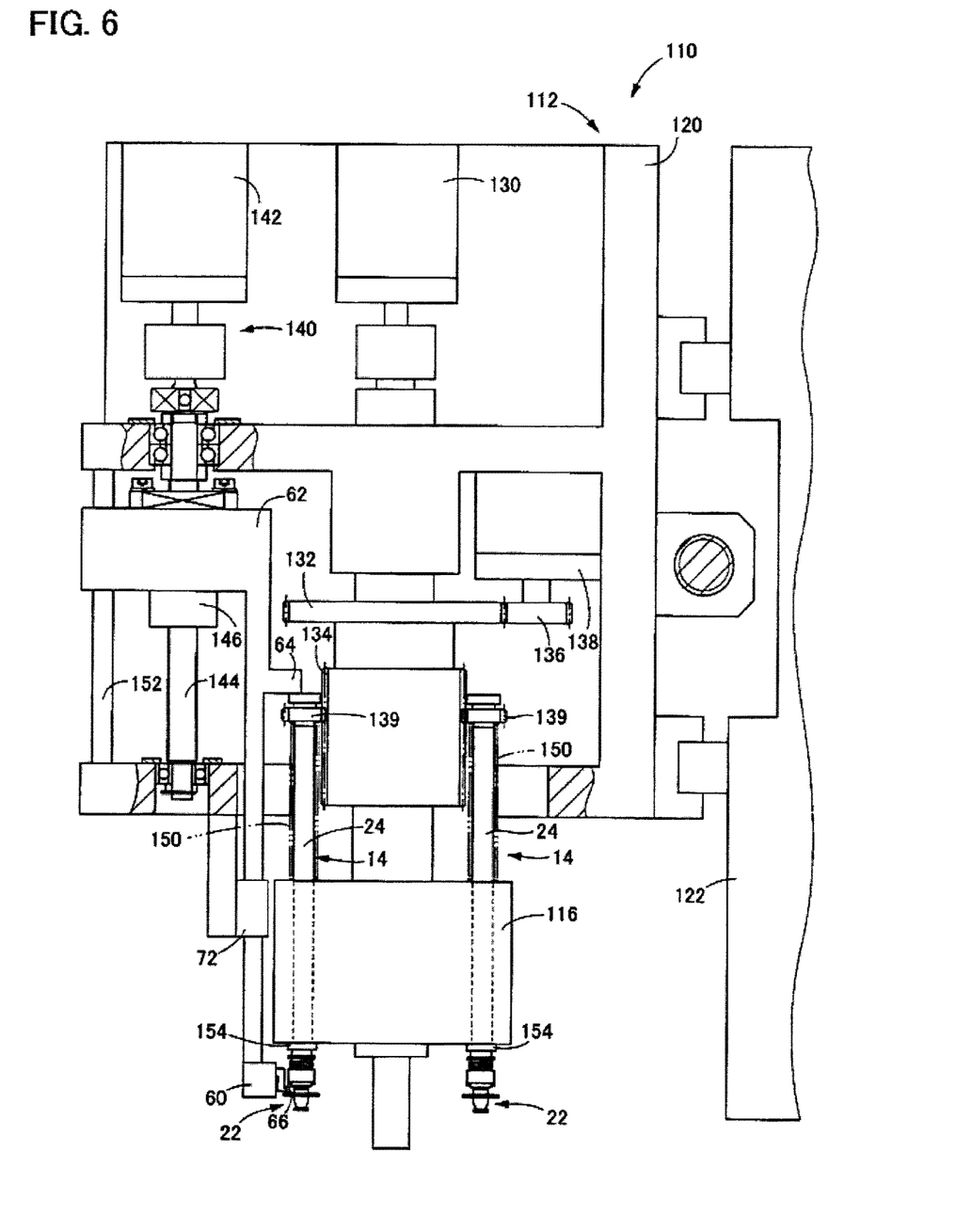
FIG. 6 This is a front view of the mounting head of a different embodiment of the disclosure.

Another embodiment of the disclosure is shown in FIG. 6. In this embodiment, the same symbols are used for items which realize functions which are the same as in the previous embodiment and descriptions relating to these are omitted; only the points which are different are described. A difference between mounting head 110 of this embodiment and the previous mounting head 10 is that head main body 112 is formed from two sections which are capable of relative movement with each other, in other words, rotor 116 which forms first section which is capable of rotation about an axis line, and X slider 120 which forms second section which rotatably holds that rotor 116. X slider 120 is held on Y slider 122 movably in the X-axis direction, and because Y slider 122 is movable in the Y-axis direction which is perpendicular to the X axis, mounting head 110 is capable of being moved to any position inside a horizontal X-Y coordinate plane. It should be noted that this mounting head 110 is not raised/lowered in a vertical direction perpendicular to the X-Y coordinate plane, instead, the raising/lowering stroke of rotating/raising/lowering axis 14 has been made larger.

The above rotating/raising/lowering axis 14 is provided at multiple positions, six positions in the example shown in the figure, spaced at even angles on a circumference centered around a rotation axis line of rotor 116, such that each are rotatable and slidable in a direction parallel to the rotation axis line. Rotor 116 is rotated by rotor rotating driving motor 130. Also, gears 132 and 134 are engaged on the outer surface of rotor 116 as to be rotatable as one, and are rotated by nozzle rotating driving motor 138 via pinion 136, and multiple sets of rotating/raising/lowering axis 14 and suction nozzle 22 are rotated together via multiple pinions 139.

Among the above multiple rotating/raising/lowering axes 14, the one which is rotated by the rotation of rotor 116 to the component takeout/mounting position is raised/lowered by first raising/lowering driving device 140. In this embodiment, first raising/lowering driving device 140 is configured from raising/lowering driving motor 142 which is a rotating motor, feed screw 144, and nut 146. Also, rotating/raising/lowering axis 14 is biased upwards by compression coil spring 150, and snap ring 154 attached near the bottom of rotating/raising/lowering axis 14 is held at an upper raising limit by contacting the bottom surface of rotor 116. Thus, first engaging section 64 of raising/lowering driving member 62 engages with the top surface of rotating/raising/lowering axis 14 and lowers rotating/raising/lowering axis 14 against the biasing force of compression coil spring 150. It should be noted that raising/lowering driving member 62 is guided when raised/lowered by guide rod 152 and guide 72.

In this embodiment, rotating/raising/lowering axis 14 and second linear motor 60 are both raised/lowered by first raising/lowering driving device 140; and further second linear motor 60 as second raising/lowering driving device raises/lowers suction nozzle 22 with respect to rotating/raising/lowering axis 14, thereby mitigating the contact impact when suction nozzle 22 contacts component 86 and when component 86 held by suction nozzle 22 contacts the printed board. Also, first engaging section 64 and second engaging section 66 engage with rotating/raising/lowering axis 14 and suction nozzle 22 in a state which allows their rotation; and this embodiment further allows engagement and separation in a direction perpendicular to the raising/lowering direction of rotating/raising/lowering axis 14 and suction nozzle 22 in accordance with the rotation of rotor 116.

Figure 7:
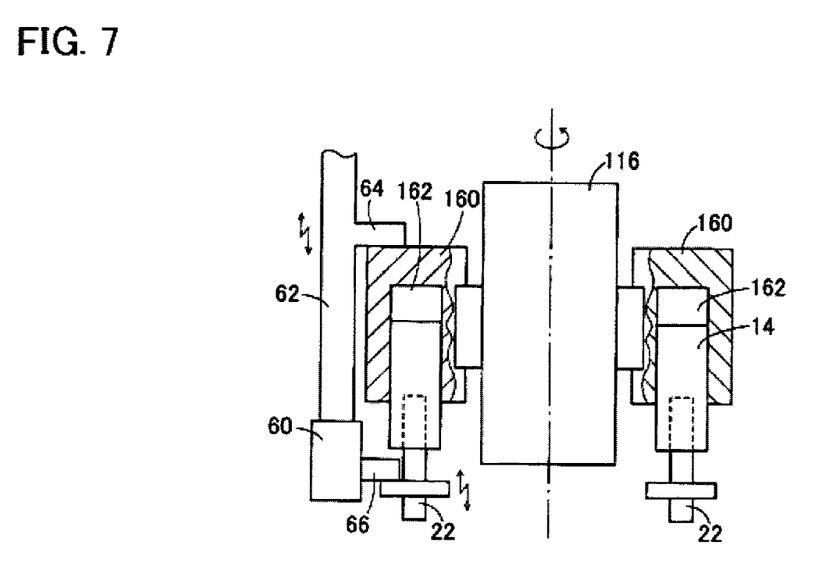
FIG. 7 This is partial cross-section front view of the mounting head of yet another different embodiment of the disclosure.

Another embodiment of the disclosure is shown in FIG. 7. This embodiment is equivalent to the item in the above embodiment in which rotating/raising/lowering axis 14 is held indirectly on rotor 116 via raising/lowering block 160. Rotating/raising/lowering axis 14, as well as being held on raising/lowering block 160 as to be rotatable and not capable of relative movement in the axis direction, and being rotated with respect to raising/lowering block 160 by nozzle rotating driving motor 162, is raised/lowered in accordance with raising/lowering block 160 being raised/lowered by first engaging section 64 of raising/lowering driving member 62. It should be noted that, although omitted from the figure, raising/lowering block 160, as well as being biased upwards by a biasing means, is held at a position not quite contacting with first engaging section 64 by a stopper. Other points, starting with suction nozzle 22 being held on rotating/raising/lowering axis 14 as to be not capable of relative rotation and capable of being raised/lowered, and being raised/lowered relative to rotating/raising/lowering axis 14 by second engaging section of second linear motor 60 attached to raising/lowering driving member 62, are the same as the above embodiment, thus detailed figures and descriptions are omitted.

In another embodiment of the disclosure, although omitted from the figures, it is possible to have an item in which: as well as first section 16 and second section 20 of head main body 12 shown in FIG. 1 being configured from members which are separate from each other; first section 16 holds rotating/raising/lowering axis 14 at multiple positions on a circumference centered around an axis line such that each is capable of rotation and being raised/lowered, and is an item which does not rotate; instead second section 20 is an item which rotates about the above axis line at the inside of first section 16. In this embodiment, first engaging section 64 of raising/lowering/driving member 62 and second engaging section 66 of second linear motor 60 as a second raising/lowering driving device, selectively engage from the inside with one set at a time of the multiple sets of rotating/raising/lowering axis 14 and suction nozzle 22 and are raised/lowered. Other points are the same as the previous embodiment shown in FIG. 6, thus detailed descriptions are omitted.

REFERENCE SIGNS LIST

10: Mounting head (electronic circuit component mounting head)
12: Head main body
14: Rotating/raising/lowering axis
16: First section (of head main body)
18: First linear motor
20: Second section (of head main body)
22: Suction nozzle
24: Raising/lowering axis main body
26; Nozzle holding section
30: Engaging hole
32: Nozzle holding member
34: Axis section
36: Pin
38: Elongated hole
40: Cutout
42: Pin receiving section
46: Compression coil spring
52: Lock sleeve
54: Compression coil spring
58: Negative pressure passage
60: Second linear motor
62: Raising/lowering driving member
64: First engaging section
66: Second engaging section
86: Component (electronic circuit component)
90: Control system
98: Bottom surface (of nozzle holding member) (stopper)
100: Suction nozzle
102: Nozzle main body
104: Tip member
106: Ball plunger
110: Mounting head
112: Head main body
116: Rotor
120: X slider

The invention claimed is:

1. An electronic circuit component mounting head comprising:
   a head main body;
   a raising-lowering member which is guided on the head main body as to be capable of being raised and/or lowered;
   a first raising-lowering driving device which raises and/or lowers the raising-lowering member with respect to the head main body;
   a component holding tool which holds an electronic circuit component and is held by the raising-lowering member as to be capable of being raised and/or lowered relative to the raising-lowering member;
   a second raising-lowering driving device which is raised and/or lowered together with the raising-lowering member by the first raising-lowering driving device and which raises and/or lowers the component holding tool relative to the raising-lowering member;
   a biasing device provided between the raising-lowering member and the component holding tool, the biasing device biases the component holding tool either up or down relative to the raising-lowering member; and a stopper provided on the raising-lowering member, wherein the second raising-lowering driving device engages with the component holding tool against a biasing force of the biasing device without acting via an elastic member, and in that state, the second raising-lowering driving device mounts the electronic circuit component on a circuit substrate, wherein the stopper defines the upper raising limit or lower lowering limit of the component holding tool based on the biasing force of the biasing device, and wherein the second raising-lowering driving device separates the component holding tool, which contacts the stopper due to the biasing force of the biasing device, from the stopper against the biasing force of the biasing device, and in that state, the second raising-lowering driving device mounts the electronic circuit component on the circuit substrate.

2. The electronic circuit component mounting head according to claim 1, wherein the second raising-lowering driving device is provided outside of the raising-lowering member and the component holding tool and which includes a holding tool engaging section which engages with the component holding tool, and a gap is formed between the holding tool engaging section and the component holding tool in a state in which the component holding tool contacts the stopper due to the biasing device.

3. The electronic circuit component mounting head according to claim 1, wherein the second raising-lowering driving device is provided outside of the raising-lowering member and the component holding tool and which includes a holding tool engaging section which engages with the component holding tool, the holding tool engaging section engages with the component holding tool in a state which allows at least one of (a) rotation of the component holding tool about an axis line of the holding tool itself, and (b) relative movement of the component holding tool in a direction intersecting the axis line.

* * * * *